United States Patent [19]
Itoh et al.

[11] Patent Number: 5,388,084
[45] Date of Patent: Feb. 7, 1995

[54] NON-VOLATILE SEMICONDUCTOR MEMORY DEVICE WITH HIGH VOLTAGE GENERATOR

[75] Inventors: Yasuo Itoh, Kawasaki; Sumio Tanaka, Tokyo; Junichi Miyamoto, Yokohama; Hiroshi Nakamura, Kawasaki; Yoshihisa Iwata, Yokohama; Kenichi Imamiya, Kawasaki; Yoshihisa Sugiura, Sagamihara, all of Japan

[73] Assignee: Kabushiki Kaisha Toshiba, Kawasaki, Japan

[21] Appl. No.: 128,087

[22] Filed: Sep. 29, 1993

[30] Foreign Application Priority Data

Sep. 30, 1992 [JP] Japan .................................. 4-261863
Jun. 30, 1993 [JP] Japan .................................. 5-188859

[51] Int. Cl.$^6$ .............................................. G11C 7/00
[52] U.S. Cl. .............................. 365/226; 365/189.09; 365/185; 327/541; 327/538
[58] Field of Search ................. 365/189.09, 189.11, 365/226, 228, 185; 307/296.2, 296.6, 296.7, 296.8

[56] References Cited

U.S. PATENT DOCUMENTS

| | | | |
|---|---|---|---|
| 4,439,692 | 3/1984 | Beekmans | 307/296.2 |
| 5,072,134 | 12/1991 | Min | 307/296.8 X |
| 5,180,928 | 1/1993 | Choi | 307/296.6 |
| 5,184,035 | 2/1993 | Sugibayashi | 365/189.9 X |
| 5,247,480 | 9/1993 | Itoh | 365/189.9 |
| 5,253,201 | 10/1993 | Atsumi | 365/189.9 X |
| 5,255,224 | 10/1993 | Galbi | 365/189.9 |
| 5,267,201 | 11/1993 | Foss | 365/189.9 |
| 5,268,871 | 12/1993 | Dhong | 365/226 |
| 5,276,646 | 1/1994 | Kim | 365/189.9 |

*Primary Examiner*—Eugene R. LaRoche
*Assistant Examiner*—Son Mai
*Attorney, Agent, or Firm*—Finnegan, Henderson, Farabow, Garrett & Dunner

[57] ABSTRACT

Disclosed is a semiconductor integrated circuit device, which comprises a booster circuit for boosting a source voltage, a voltage limiter having one end connected to the output terminal of the booster circuit, for limiting the output voltage of the booster circuit to a given value, and a voltage setting circuit, connected to the other end of the voltage limiter, for arbitrarily adjusting a voltage at the other end of the voltage limiter. This design can keep the output voltage of the booster circuit at a constant level and can set that output voltage to an arbitrary voltage.

17 Claims, 13 Drawing Sheets

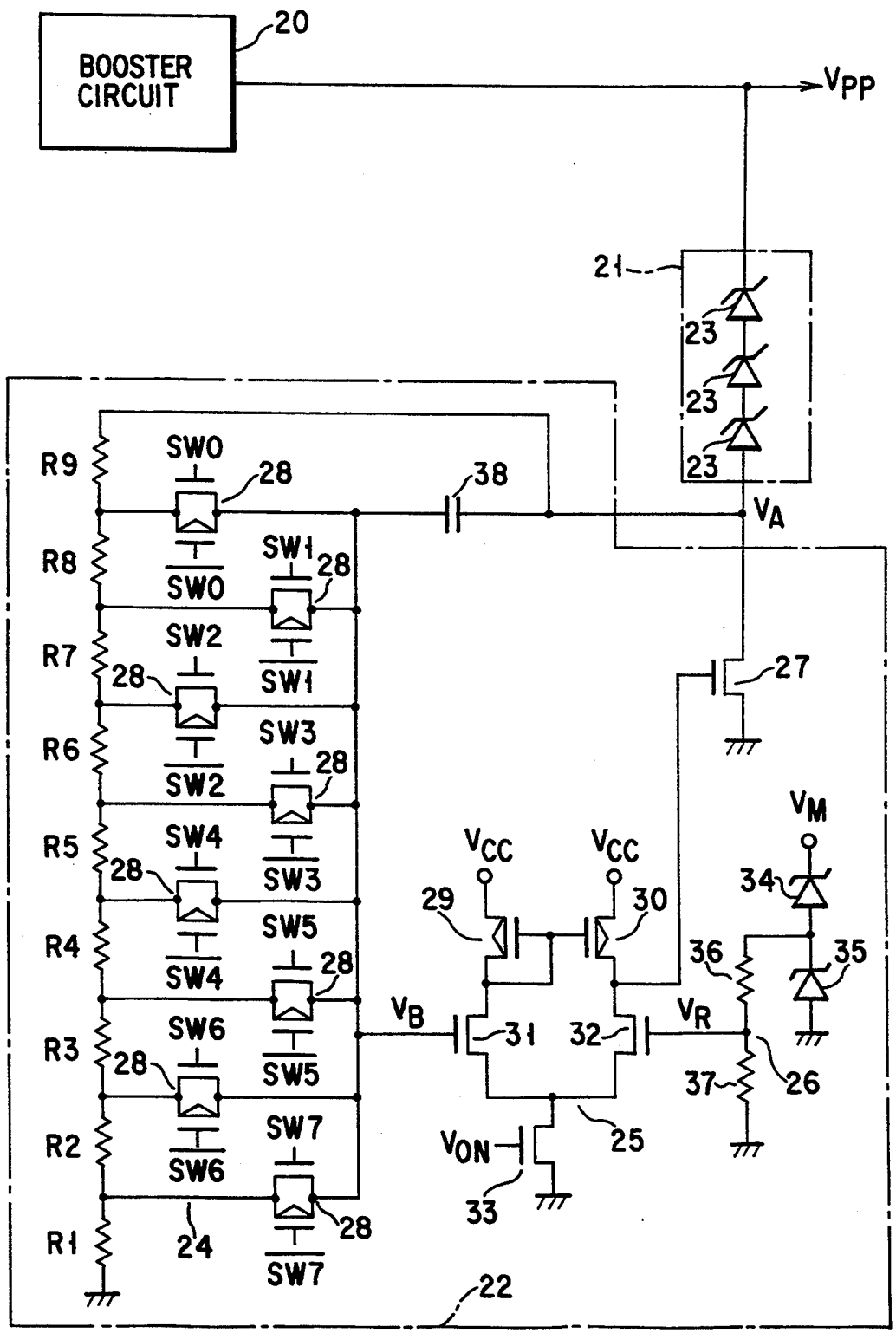
F I G. 6

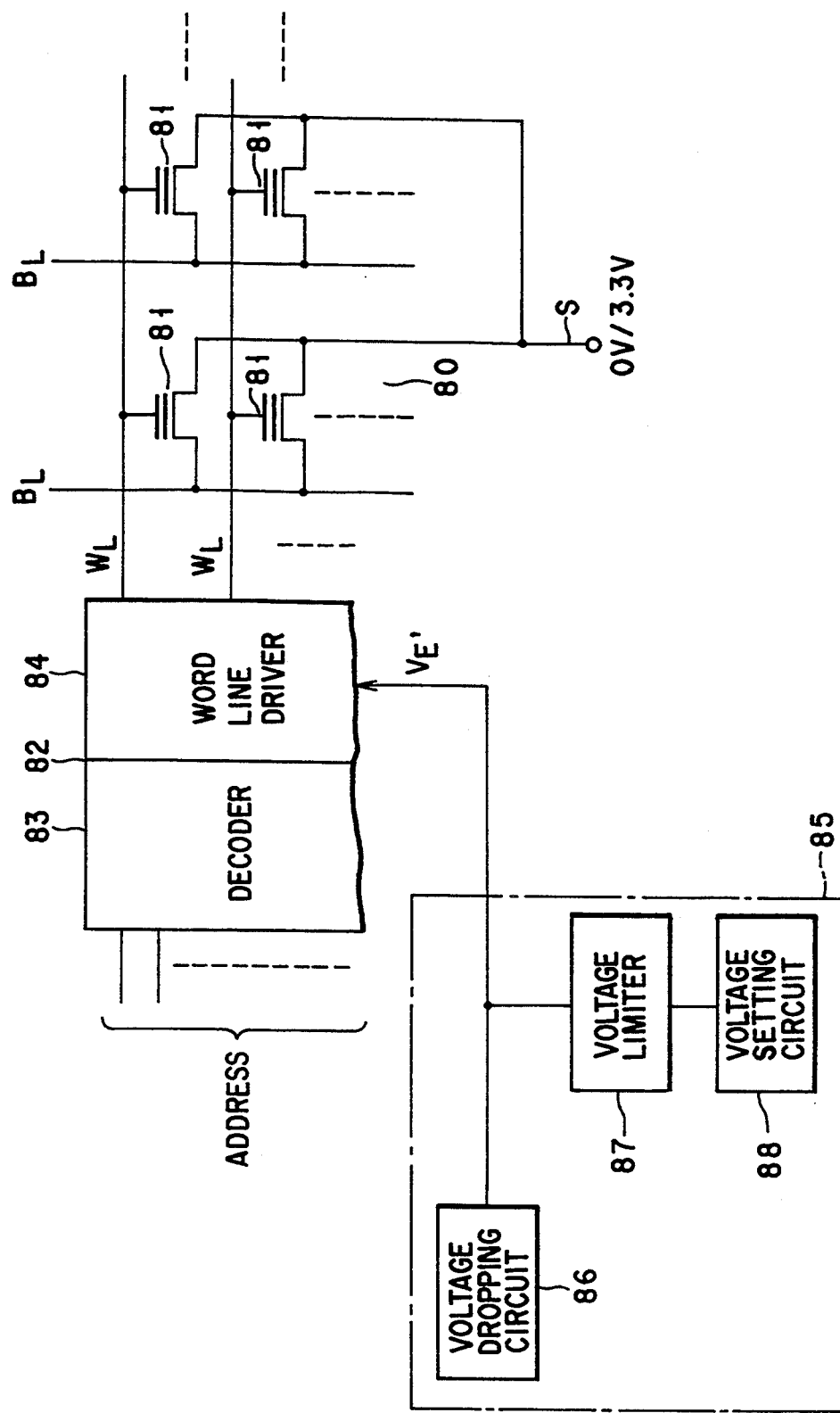
F I G. 12

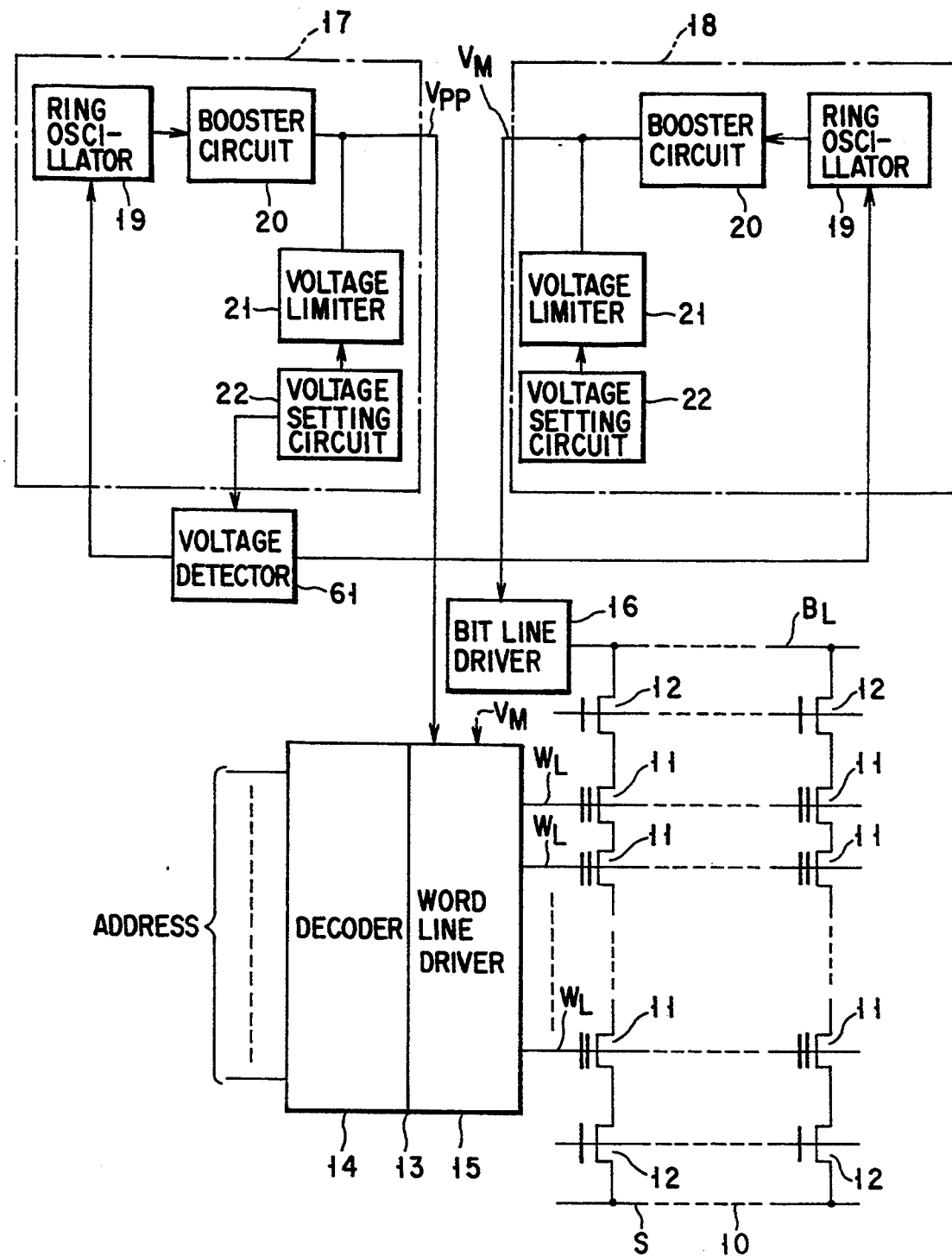
F I G. 13

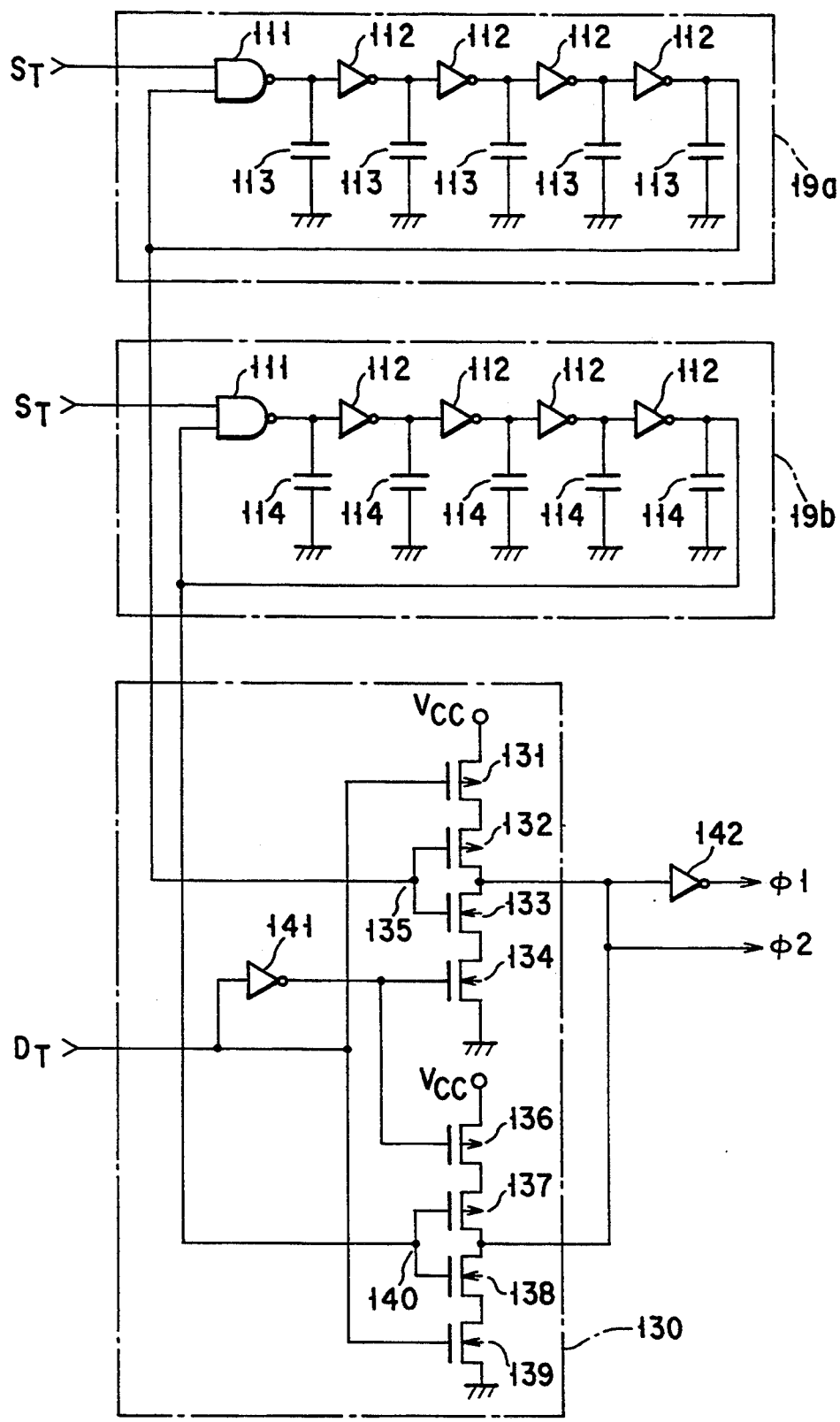
F I G. 19

NON-VOLATILE SEMICONDUCTOR MEMORY DEVICE WITH HIGH VOLTAGE GENERATOR

BACKGROUND OF THE INVENTION

1. Field of the Invention

The present invention relates to a non-volatile semiconductor device which includes non-volatile memory cells and has a high voltage generator for generating a high voltage that is used at the time of data erasure and, particularly, at the time of data writing.

2. Description of the Related Art

EEPROMs are one type of non-volatile semiconductor devices. Of those EEPROMs, a NAND cell type EEPROM comprising a plurality of memory cells connected in series is known as a memory device which can accomplish high integration of memory cells. FIG. 1 illustrates the structure of the memory cell used in this NAND cell type EEPROM. A source 91 and a drain 92 are formed in a semiconductor substrate 90. A floating gate 93 and a control gate 94 are deposited via an insulating film on the substrate 90.

A NAND cell has a plurality of memory cells 95, each shown in FIG. 1, connected in series. More specifically, as shown in FIG. 2, each NAND cell has one end connected via a select gate 96 to a bit line BL and the other end connected via a select gate 97 to a common source line S. A plurality of such memory cells are arranged in a matrix, constituting an EEPROM, with control gates serially connected in a columnar direction, forming a word line WL.

Such a NAND cell type EEPROM functions as follows. Data writing is performed on the memory cells in order, starting from the one located farther away from the bit line BL. With memory cells each constituted of an n channel MOS transistor, a boosted write voltage VPP (about 20 V) is applied to the control gate of a selected memory cell. An intermediate voltage VM (about 10 V) is applied to the control gates and select gates of non-selected memory cells located on the bit line side. In accordance with data, 0 V (e.g., data "0") or the intermediate voltage VM (e.g., data "1") is applied to the bit line. At this time, the voltage on the bit line is sequentially transferred by the non-selected memory cells to reach the drain of the selected memory cell. When write data is "0," a high electric field is applied between the floating gate and the drain of the selected memory cell and tunnel injection of electrons from the drain to the floating gate occurs, shifting the threshold voltage to the positive direction. When write data is "1," the threshold voltage does not change.

Data erasure is performed simultaneously on all the memory cells in the NAND cell. More specifically, 0 V is applied to all the control gates and select gates, and a boosted erase voltage VE (about 20 V) is applied to the p-type well region (not shown) and the n-type substrate. As a result, electrons are discharged from the floating gate into the p-type well region in every memory cell, shifting the threshold voltage to the negative direction.

In reading data, a reference voltage of 0 V is applied to the control gate of the selected memory cell and a source voltage vcc (e.g., 3.3 V) is applied to the control gates and select gates of the other memory cells. At this time, a sense amplifier (not shown) detects if a current flows through the selected memory cell, thus accomplishing data reading.

In the NAND cell type EEPROM, the aforementioned word line, intermediate voltage VM and erase voltage VE are generated by a high voltage generator which boosts the source voltage vcc (3.3 V) to acquire a high voltage.

The structure of a conventional high voltage generator of this type is illustrated in FIG. 3. This high voltage generator comprises a booster circuit 102, which has an even number of charge pump circuits 101 cascade-connected in multi-stages, and a voltage limiter 103 connected to the last stage of the charge pump circuit in the booster circuit 102.

Each charge pump circuit 101 comprises a MOSFET 104 having a gate and one of its source and drain connected to the source voltage Vcc of 3.3 V, a MOSFET 105 having a gate and one of its source and drain connected to the other one of the source and drain of the MOSFET 104, and a capacitor 106 having one end connected to the other one of the source and drain of the MOSFET 104. The other one of the source and drain of the MOSFET 105 in the preceding stage is connected to one of the source and drain of the MOSFET 105 in the subsequent stage, thus allowing charge pump circuits 101 to be cascade-connected. Two clock signals $\phi 1$ and $\phi 2$ having different phases as shown in FIG. 4, which are obtained by an oscillation circuit, such as a ring oscillator, are alternately supplied to the other end of the capacitor 106.

The voltage limiter 103 comprises a plurality of Zener diodes (two diodes in this example) connected in series. Assuming that the Zener breakdown voltage VZ per Zener diode is 10 V, the limit voltage of the voltage limiter is 20 V, which is the same as the write voltage VPP and the erase voltage VE, when two Zener diodes are used as shown in FIG. 3, and the limit voltage is 10 V or the intermediate voltage VM when one Zener diode is used.

In writing data in the above-described NAND cell type EEPROM, the higher the write voltage VPP is, the shorter the time required for the data writing becomes. Conventionally, however, this voltage could not be set too high and there is an upper limit for the following reason.

Supposed that VPP is set too high at the time of data writing and the threshold voltage of a memory cell among the series-connected memory cells in a NAND cell is shifted too much in the positive direction. Even if that memory cell is a non-selected memory cell and the source voltage of 3.3 V is applied to its control gate at the time of data reading, this non-selected memory cell will not be turned on, disabling data reading from a selected memory cell. That is, if the write voltage VPP is set too high, overwriting occurs at the time of data writing.

This overwriting may occur by a change in external temperature. Even if 20 V, the normal write voltage, is obtained at one temperature in the high voltage generator with the structure shown in FIG. 3, when the Zener breakdown voltage rises due to a change in external temperature, VPP also rises. Assume that the amount of the shift of the normal threshold voltage has been acquired at the writing speed of, for example, 100 μsec when the write voltage VPP is 20 V. As VPP rises to 23 V, for example, the amount of the shift of the threshold voltage at the writing speed of 100 μsec becomes large.

As a solution to such overwriting, conventionally, an intelligent writing system has been developed. This system raises the write voltage VPP gradually and accomplishes data writing in a plurality of writing actions, not in one action. The intelligent writing system repeats writing data and reading data after data writing. When the read data matches with the written data, this system terminates the writing operation.

As the intelligent writing system should perform data writing a plurality of times, it undesirably needs a longer time to accomplish data writing.

Further, the intelligent writing system requires a comparator, etc. so that its circuit structure inevitably becomes complex.

SUMMARY OF THE INVENTION

It is therefore an object of the present invention to provide a semiconductor integrated circuit device, which can always generate constant optimal data writing voltage and erasing voltage, thus shortening the time for programming, such as data writing, and can change the voltage value.

To achieve this object, according to one aspect of this invention, there is provided a semiconductor integrated circuit device which comprises booster means for boosting a power source voltage; voltage limiting means having two ends one of which is connected to an output terminal of the booster means, for limiting an output voltage of the booster means to a given value; and voltage setting means, connected to the other end of the voltage limiting means, for arbitrarily adjusting a voltage at the other end of the voltage limiting means.

According to another aspect of this invention, there is provided a semiconductor integrated circuit device which comprises booster means for boosting a power source voltage; voltage limiting means having two ends one of which is connected to an output terminal of the booster means, for limiting an output voltage of the booster means to a given value; voltage setting means, connected to the other end of the voltage limiting means, for arbitrarily adjusting a voltage at the other end of the voltage limiting means; a plurality of NAND cells each having a plurality of series-connected MOSFETs each having a floating gate and a control gate; a plurality of word lines to which the control gates of the memory cells of each of the plurality of NAND cells are respectively connected; and address decoding means, connected to the output terminal of the booster means, for selectively supplying a voltage appearing on the output terminal of the booster means to the plurality of word lines in accordance with an address input.

According to a further aspect of this invention, there is provided a semiconductor integrated circuit device which comprises voltage dropping means for dropping a power source voltage; voltage limiting means having two ends one of which is connected to an output terminal of the voltage dropping means, for limiting an output voltage of the voltage dropping means to a given value; voltage setting means, connected to the other end of the voltage limiting means, for arbitrarily adjusting a voltage at the other end of the voltage limiting means; and a plurality of memory cells each constituted of an erasable and programmable MOSFET having a floating gate and a control gate which is supplied with a voltage appearing on the output terminal of the voltage dropping means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a circuit diagram showing the detailed structures of a voltage limiter and a voltage setting circuit in the high voltage generator shown in FIG. 5;

FIG. 12 is a circuit diagram showing the structure of a NOR cell type EEPROM according to a second embodiment of the present invention;

FIG. 13 is a circuit diagram showing the structure of a NAND cell type EEPROM according to a third embodiment of the present invention;

FIG. 19 is a circuit diagram showing specific structures of two ring oscillators and a selector for selecting one of the outputs of those oscillators, which are included in one of high voltage generators of the EEPROM of this embodiment shown in FIG. 18.

DETAILED DESCRIPTION OF THE PREFERRED EMBODIMENTS

Preferred embodiments of the present invention will now be described referring to the accompanying drawings.

Figures 4, 5:
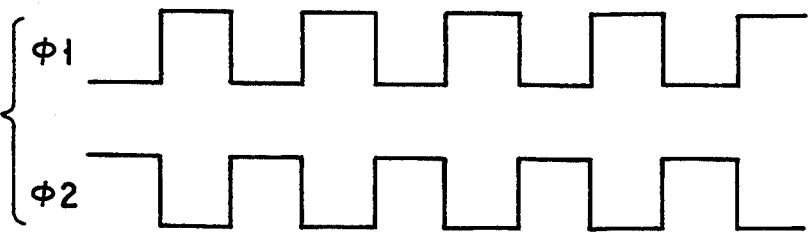
FIG. 4 is a waveform diagram showing two clock signals with different phases used in the high voltage generator shown in FIG. 3.
FIG. 5 is a circuit diagram showing the structure of a NAND cell type EEPROM according to a first embodiment of the present invention.

FIG. 5 presents a circuit diagram showing the structure of a NAND cell type EEPROM according to the first embodiment of the present invention.

Figure 1:
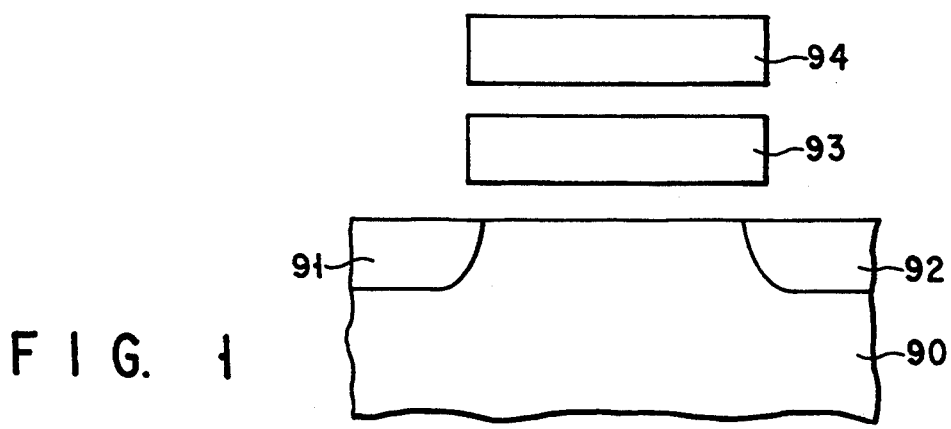
FIG. 1 is a cross section showing one memory cell of a NAND cell type EEPROM.
Figure 2:
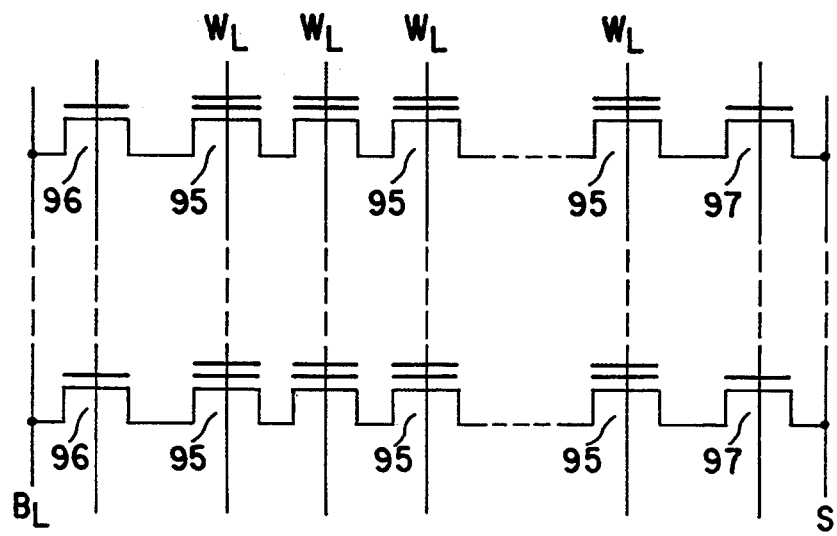
FIG. 2 is a circuit diagram of a NAND cell using the memory cells shown in FIG. 1.

In this diagram, a memory cell array 10, like the one shown in FIG. 2, comprises a plurality of memory cells 11 each constituted of an N channel MOSFET having a floating gate and a control gate, and two select gates 12 each constituted of an N channel MOSFET. Like the conventional type, the control gates of the memory cells 11 constituting each NAND cell are connected to word lines WL, the select gate 12 connected to the drain at one end of each NAND cell is connected to a bit line BL, and the other select gate 12 connected to the source at the other end is connected to a common source line S.

The word lines WL are selectively driven on the basis of address signals at the time of data writing, data erasure and data reading. Those address signals are supplied to an address decoder 13. The address decoder 13 comprises a decoder 14 for decoding the input address signals and a word line driver 15 for supplying a predetermined voltage to the word lines WL in accordance with the output of this decoder 14. The word line driver 15 receives an erase voltage VE of, for example, 20 V, a source voltage Vcc of, for example, 3.3 V and a reference voltage of 0 V (all three not shown) in addition to a write voltage VPP of, for example, 20 V and an intermediate voltage VM of, for example, 10 V.

The source voltage Vcc and intermediate voltage VM output from the bit line driver 16 are selectively supplied to the bit line BL.

Reference numerals "17" and "18" denote high voltage generators which respectively generate the write voltage VPP and the intermediate voltage VM. Each high voltage generator 17 or 18 comprises a ring oscillator 19, a booster circuit 20, a voltage limiter 21 and a voltage setting circuit 22.

Figure 3:
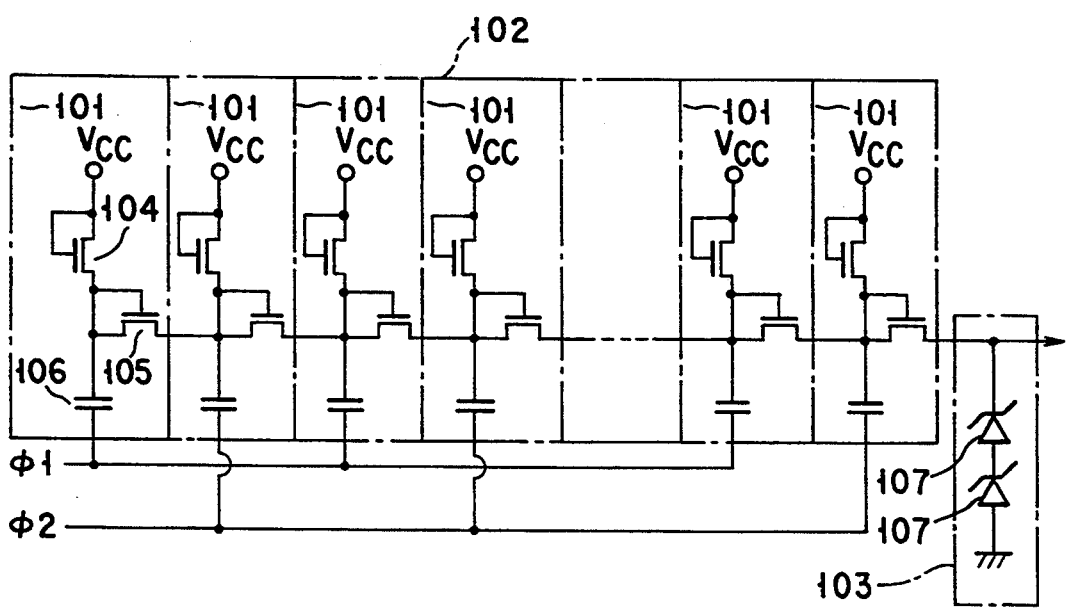
FIG. 3 is a circuit diagram of a conventional high voltage generator.

The booster circuit 20 boosts the source voltage Vcc to acquire a high voltage, and, like the one shown in FIG. 3, is constituted by charge pump circuits. The ring oscillator 19 oscillates at a predetermined period, generating two clock signals $\phi 1$ and $\phi 2$ of different phases as shown in FIG. 4, which are used in the booster circuit 20. A single ring oscillator 19 may be provided commonly for both high voltage generators 17 and 18 so that the clock signals $\phi 1$ and $\phi 2$ can be shared by those voltage generators 17 and 18.

One end of each voltage limiter 21 is connected to the output terminal of the associated booster circuit 20, so that the high voltage acquired by the booster circuit 20 can be limited to a given value by this voltage limiter 21. The other end of each voltage limiter 21 is connected to the associated voltage setting circuit 22, which arbitrarily sets the voltage at the other end of that voltage limiter 21. Accordingly, the values of the write voltage VPP and intermediate voltage VM can be altered as desired.

FIG. 6 is a circuit diagram showing the detailed structures of the voltage limiter and the voltage setting circuit in one high voltage generator shown in FIG. 5, which generates the write voltage VPP.

The voltage limiter 21 comprises three Zener diodes 23 connected in series with their cathodes arranged toward the output terminal side of the booster circuit 20. The Zener breakdown voltage VZ of each Zener diode 23 is set to a value where there is hardly any temperature characteristic, for example, near 5 V. The desirable value for VZ ranges from 4 V to 7 V. Therefore, the total Zener breakdown voltage in this voltage limiter 21 is about 15 V.

The voltage setting circuit 22 comprises a voltage generator 24, a voltage comparator 25, a comparison voltage generator 26 and an N channel MOSFET 27 for dropping a voltage.

The voltage generator 24 has nine voltage-dividing resistors R1 to R9 connected in series between the reference voltage of 0 V and the other end of the voltage limiter 21, and eight CMOS transfer gates 28 having one ends respectively connected to the nodes between the series-connected resistors R1-R9 and the other ends connected together. The registers R1-R9 can be formed of a polysilicon layer or a diffusion layer. The eight CMOS transfer gates 28 may be replaced by eight N channel MOS transistors.

Complementary pairs of control signals SW0 and $\overline{SW0}$ to SW7 and $\overline{SW7}$ are supplied to the N channel side and P channel side gates of the eight CMOS transfer gates 28 respectively. In other words, in the voltage setting circuit 22, the potential difference between a voltage VA at the other end of the voltage limiter 21 and the reference voltage is divided into eight by the nine resistors R1-R9, and one of the transfer gates 28 is rendered conductive in accordance with the control signal pairs SW0 and $\overline{SW0}$ to SW7 and $\overline{SW7}$, so that an associated one of the divided eight voltages is selected.

The voltage comparator 25 is a differential type operational amplifier comprising P channel MOSFETs 29 and 30 and N channel MOSFETs 31, 32 and 33. A voltage VB selected by the voltage generator 24 is supplied to the gate of the N channel MOSFET 31. A comparison voltage VR (which will be described later) generated in the comparison voltage generator 26 is supplied to the gate of the N channel MOSFET 32. The voltage comparator 25 compares both voltages VB and VR with each other. A control signal VON is supplied to the gate of the N channel MOSFET. 33 in the voltage comparator 25. When this signal VON is at a "1" level (3.3 V), the MOSFET 31 conducts, allowing the voltage comparator 25 to perform its comparison. The logical level of the signal VON is set on the basis of the data write/read control signal R/W for this EEPROM.

The comparison voltage generator 26, which serves to stably generate the comparison voltage VR, is supplied with the intermediate voltage VM that is generated by the other high voltage generator 18 having the same structure as this high voltage generator 17. This intermediate voltage VM is divided into two by two series-connected Zener diodes 34 and 35, and the resultant voltage is further divided by two series-connected resistors 36 and 37 in accordance with the resistance ratio, yielding the comparison voltage VR.

The voltage-dropping MOSFET 27 has a source connected to the other end of the voltage limiter 21, a drain connected to the reference voltage, and a gate supplied with the output voltage of the voltage comparator 25. In other words, the gate of the MOSFET 27 is controlled by the output of the voltage comparator 25 so that the conducting resistance between its source and drain varies and the value of voltage drop between the source and drain changes according to the conducting resistance, thus setting the voltage VA at the other end of the voltage limiter 21.

A capacitor 38 is connected between the other end of the voltage limiter 21 and the gate of the MOSFET 31 in the voltage comparator 25. The capacitor 38 performs two functions. The first function is to prevent the voltage setting circuit 22 from oscillating. The second function is to help the circuit 22 to operate reliably.

The function of the thus constituted circuit will now be described.

After power is given, the ring oscillator 19 starts oscillating, supplying the clock signals $\phi 1$ and $\phi 2$ to the booster circuit 20, so that the boosting of the source voltage Vcc starts. When the output voltage of the booster circuit 20 becomes sufficiently high, this voltage is limited by the voltage limiter 21 to a voltage (15 V+VA) which is the sum of the voltage three times the zener breakdown voltage of a single Zener diode, i.e., 5 V×3=15 V, and the voltage VA at the other end of the voltage limiter 21.

Assuming that the control signals SW3 and $\overline{SE3}$ are respectively set to a "1" level (3.3 V) and "0" level (0 V), one CMOS transfer gate 28 in the voltage generator 24 in FIG. 6 to which the control signal pair SW3 and $\overline{SW3}$ are input will conduct. At this time, the other CMOS transfer gates 28 are all rendered non-conductive. The output voltage VB of the voltage generator 24 is given by the following equation.

$$VB = \{(R1+R2+R3+R4+R5)/(R1+R2+\ldots+R8+R9)\} \cdot VA \quad 1$$

As both input voltages VB and VR of the voltage comparator 25 become equal to each other due to the general function of the operation amplifier, letting R1+R2+R3+R4+R5=RA and R6+R7+R8+R9=RB, VA is given by the following equation.

$$VA = (1+RB/RA) \cdot VR \quad 2$$

It is apparent from those two equations that VA can be changed by changing the value of (RB/RA), thus changing the value of VPP as needed. The value of (RB/RA) is determined by which one of the eight CMOS transfer gates 28 in the voltage generator 24 is rendered conductive, and the conductive control of those CMOS transfer gates 28 is accomplished by properly setting the logical levels of the control signal pairs SW0 and $\overline{SW0}$ to SW7 and $\overline{SW7}$.

Suppose that the comparison voltage VR is set to 2.5 V and the value of (RB/RA) is set to 1, VA becomes 4 V from the above two equations. In this case, therefore, VPP=(15 V+VA)=(15 V+5 V)=20 V.

Since the limiting voltage in the voltage limiter 21 is determined by the three Zener diodes 23 that hardly has a temperature characteristic, the total Zener breakdown voltage, 15 V, in this voltage limiter 21 hardly changes with a change in temperature. Further, since the voltage at the other end of the voltage limiter 21 is provided from the comparison voltage VR which hardly has a temperature characteristic, that voltage also hardly varies with a change in temperature. Accordingly, the value of VPP has a small change with a change in temperature and can be changed as needed within a certain range. The other high voltage generator 18 in FIG. 5 that generates the intermediate voltage VM, has the same function of the high voltage generator 17.

The write voltage VPP generated by the high voltage generator 17 and the intermediate voltage VM generated by the high voltage generator 18 are supplied to the word line driver 15 in FIG. 5 and the intermediate voltage VM is also supplied to the bit line driver 16. Those voltages are selectively supplied to the word lines WL and the bit line BL at the time data is written in or erased from the memory cells 11.

As described earlier, data writing is performed on the memory cells in order, starting from the one located farther away from the bit line BL. The write voltage VPP is applied to the control gate of a selected memory cell. The intermediate voltage VM is applied to the control gates and select gates of non-selected memory cells located between the selected memory cell and the bit line. In accordance with data, 0 V or the intermediate voltage VM is applied to the bit line. At this time, the voltage on the bit line is sequentially transferred by the non-selected memory cells to reach the drain of the selected memory cell. When write data is "0," a high electric field is applied between the floating gate and the drain of the selected memory cell and tunnel injection of electrons from the drain to the floating gate occurs, shifting the threshold voltage to the positive direction. When write data is "1," the threshold voltage does not change.

Data erasure is performed simultaneously on all the memory cells in the NAND cell. More specifically, 0 V is applied to all the control gates and select gates, and a boosted erase voltage VE is applied to the p-type well region (not shown) and the n-type substrate. As a result, electrons are discharged from the floating gate into the p-type well region in every memory cell, shifting the threshold voltage to the negative direction.

In this embodiment, at the time data is written in the memory cells 11, the temperature characteristics of the write voltage VPP and intermediate voltage VM are small, eliminating the need for providing a margin for the temperature variation. In writing data using the aforementioned intelligent writing system, therefore, if the write voltage VPP that matches the characteristic of the memory cells is set in advance, the data writing can be accomplished in a single writing action. That is, the writing time can be shortened while the same writing characteristic as the conventional intelligent writing system is maintained. The EEPROM of this embodiment can therefore achieve high-speed writing.

Figure 7A:
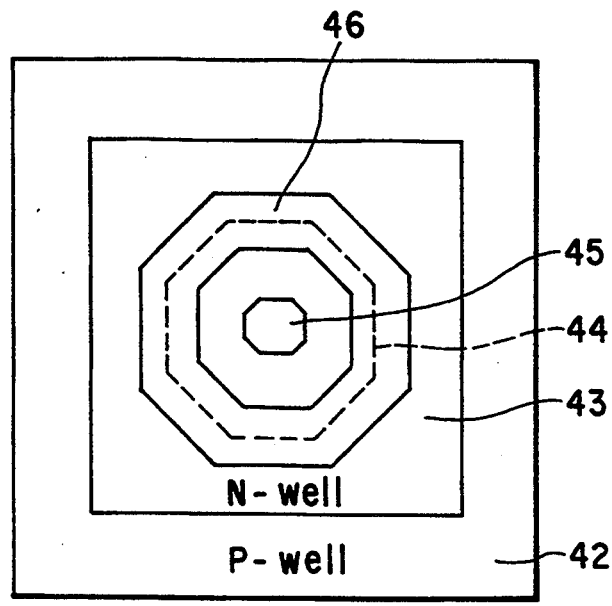
FIG. 7A is a plan view showing the structure of a Zener diode used in the voltage limiter in the embodiment shown in FIG. 5.
Figure 7B:
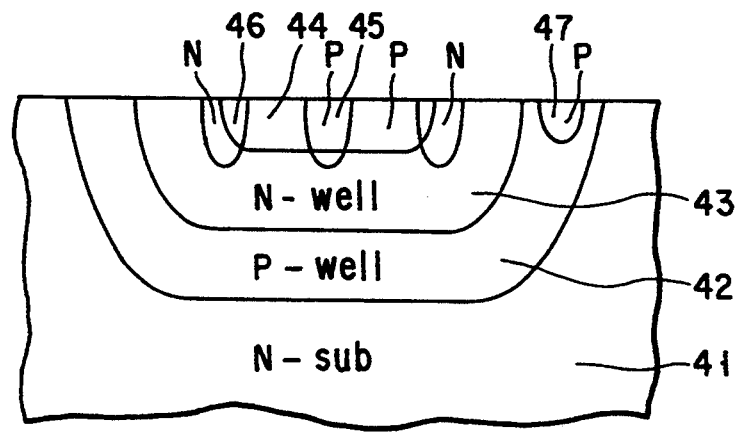
FIG. 7B is a cross-sectional view of the Zener diode in FIG. 7A.

FIG. 7A is a plan view showing the structure of a Zener diode used in the voltage limiter 21 in this embodiment, and FIG. 7B shows the cross section of the Zener diode.

This Zener diode comprises a P well (P-well) layer 42 formed on an N-type substrate (N-sub) 41, an N-well (N-well) layer 43 formed on this P-well layer 42, a P-type limiter layer 44 in this N-well layer 43, a P+ type layer 45 formed in the center portion of this limiter layer 44, an N+ type cathode contact layer 46 formed at the peripheral portion of the limiter layer 44, and a P+ type anode contact layer 47 formed on the surface of the P-well layer 42. For example, the length of one side of the P-well layer 42 is set to 28 μm, the length of one side of the N-well layer 43 is set to 20 μm, and the area of the PN junction is set to 12 μm².

It is known that in a Zener diode having the above structure, the Zener breakdown voltage VZ is determined by the value of the concentration of the P-type impurity in the P⁻ type limiter layer 44 and the value of the cathode-anode current ICP.

Figure 8:
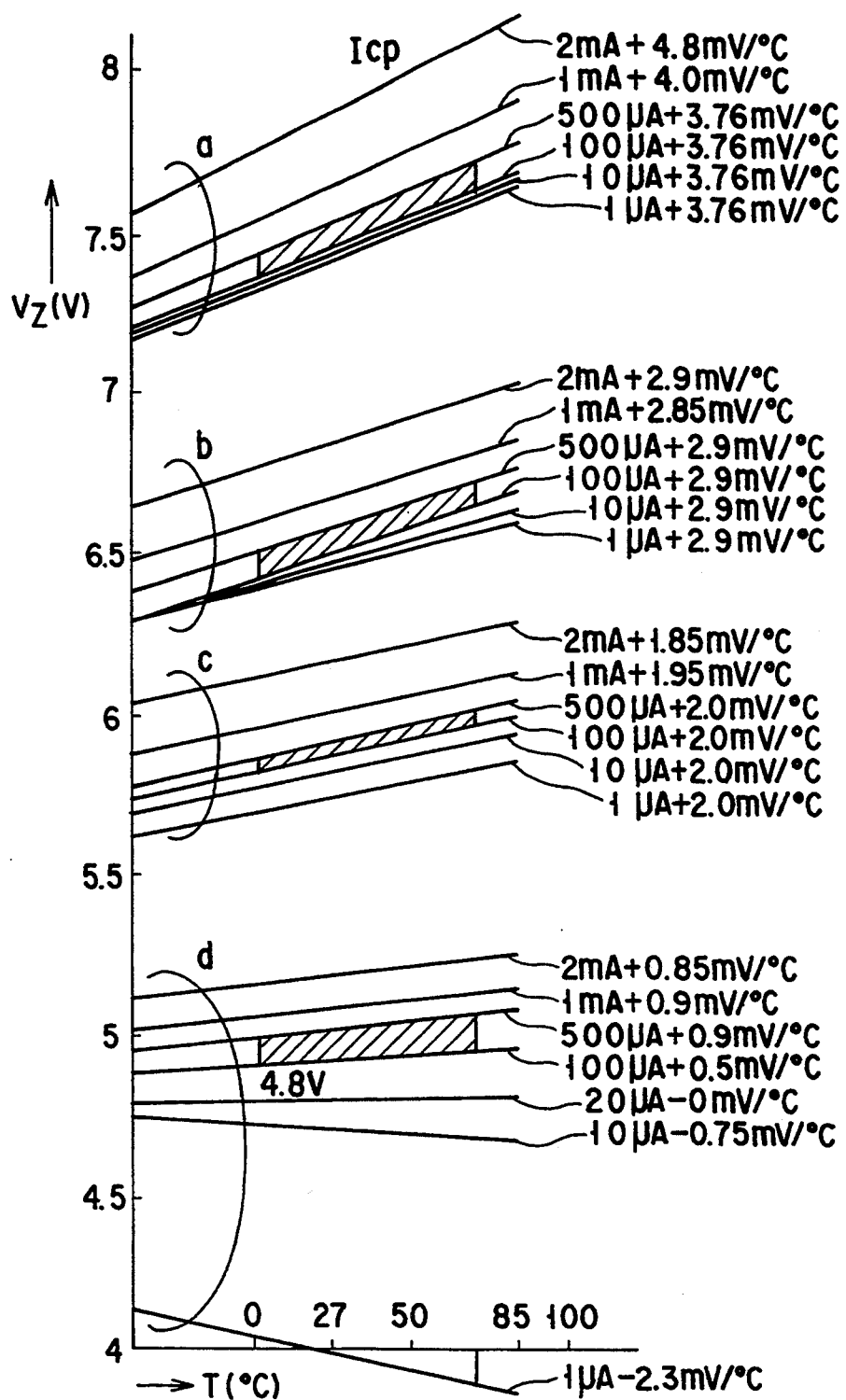
FIG. 8 is a characteristic chart showing the temperature dependency of the Zener breakdown voltage of the Zener diode shown in FIGS. 7A and 7B.

FIG. 8 is a characteristic chart showing the temperature dependency of the Zener breakdown voltage VZ of this Zener diode when the concentration of the P-type impurity of the limiter layer 44 and the cathode-anode current ICP are taken as parameters. In the diagram, "a" is the characteristic with the P-type impurity concentration set to $2.5 \times 10^{13}$, "b" is the characteristic with the P-type impurity concentration set to $4 \times 10^{13}$, "c" is the characteristic with the P-type impurity concentration set to $7 \times 10^{13}$, and "d" is the characteristic with the P type impurity concentration set to $2 \times 10^{14}$. The lines in each of the characteristics a to "d" are for the cases where the current ICP is 2 mA, 1 mA, 500 μA, 100 μA, 20 μA, 10 μA and 1 μA. As apparent from the characteristic "d", the temperature dependency is the smallest when the zener breakdown voltage VZ is set to about 5 V. For example, the temperature coefficient is +0.85 mV/° C. when ICP is 2 mA, +0.9 mV/° C. When ICP is 1 mA, +0.9 mV/° C. when ICP is 500 μA, +0.5 mV/° C. when ICP is 100 μA, +0 mV/° C. when ICP is 20 μA, and −0.75 mV/° C. when ICP is 10 μA.

When the P-type impurity concentration of the limiter layer 44 is set to $2 \times 10^{14}$ and the Zener diode with VZ of 4.8 V is used under the condition of ICP being 20 μA, the limiting voltage in the voltage limiter 21 does not have a temperature coefficient at all.

Figures 9A, 9B:
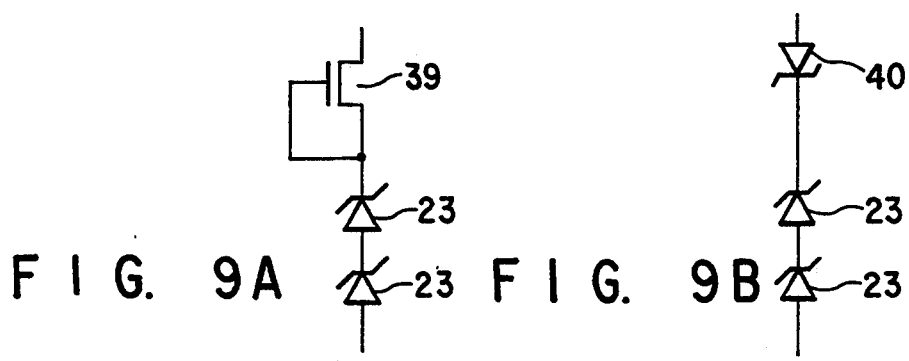
FIG. 9A is a circuit diagram showing another detailed structure of the voltage limiter in the EEPROM of the embodiment shown in FIG. 5.
FIG. 9B is a circuit diagram showing a further detailed structure of the voltage limiter in the EEPROM of the embodiment shown in FIG. 5.

FIGS. 9A and 9B illustrate further detailed structures of the voltage limiter 21. The voltage limiter 21 in FIG. 9A has two Zener diodes 23, instead of three series-connected Zener diodes 23 in the previous example, and an N channel MOSFET 39 connected in series to the two Zener diodes; the gate and source of the MOSFET 39 are connected together. Given that the threshold voltage of the MOSFET 39 is VTH, the limiting voltage in the thus constituted voltage limiter 21 becomes (2 VZ+VTH) which is about +12 V, for example.

The voltage limiter 21 in FIG. 9B has a Zener diode 40 connected in the opposite direction to the Zener diodes 23 in place of the MOSFET 39. Given that the forward dropping voltage of the zener diode 40 is VF, the limiting voltage in the thus constituted voltage limiter 21 becomes (2 VZ+VF) which is about +11 V, for example.

If the EEPROM of this embodiment is designed on a single chip, the control signal pairs SW0 and $\overline{SW0}$ to SW7 and $\overline{SW7}$ used in the voltage generator 24 in FIG. 6 can be directly input from outside the chip. In this case, however, the number of external terminals increases considerably, which is not desirable.

Figure 10:
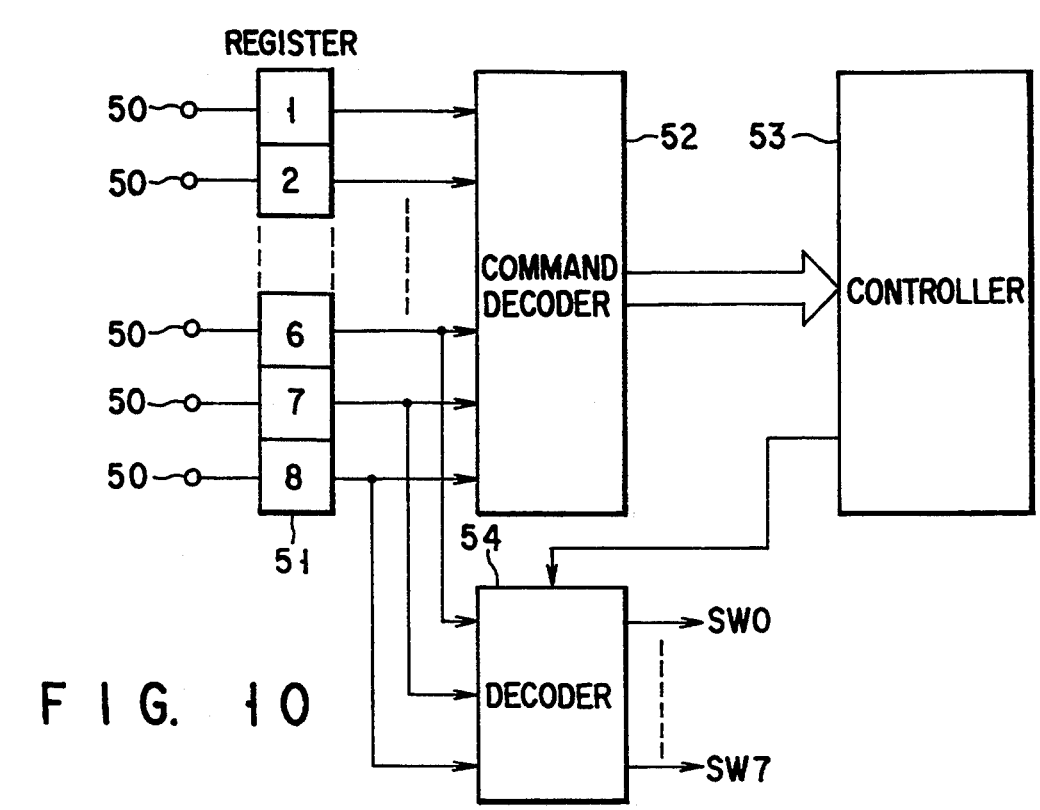
FIG. 10 is a circuit diagram of an input circuit used when a control signal used in the EEPROM of the embodiment shown in FIG. 5 is generated externally.

To input the control signal pairs SW0 and $\overline{SW0}$ to SW7 and $\overline{SW7}$ from outside the chip, therefore, an input circuit as shown in FIG. 10 is used. In the diagram, reference numeral "50" denotes external terminals to which an 8-bit control signal is supplied to control the function of the EEPROM of this embodiment. The control signal supplied to those external terminals 50 is given to an 8-bit register 51 for temporary storage. The signal held in this register 51 is decoded by a command decoder 52 before being supplied to a controller 53. Based on an instruction from this controller 53, the normal function of the EEPROM is controlled.

A mode for generating the control signal pairs SW0 and $\overline{SW0}$ to SW7 and $\overline{SW7}$ is set in accordance with the level of, for example, the first bit of the signal in the register 51, and a decoder 54 is enabled by an instruction output from the controller 53 when in this mode. This decoder 54 is supplied with a 3-bit signal consisting of, for example, 6-th to 8-th bits of the signal in the register 51. When enabled, the decoder 54 decodes the 3-bit signal to generate the eight control signals SW0–SW7. The inverted signals of SW0–SW7 can be formed by using an inverter (not shown).

Figure 11:
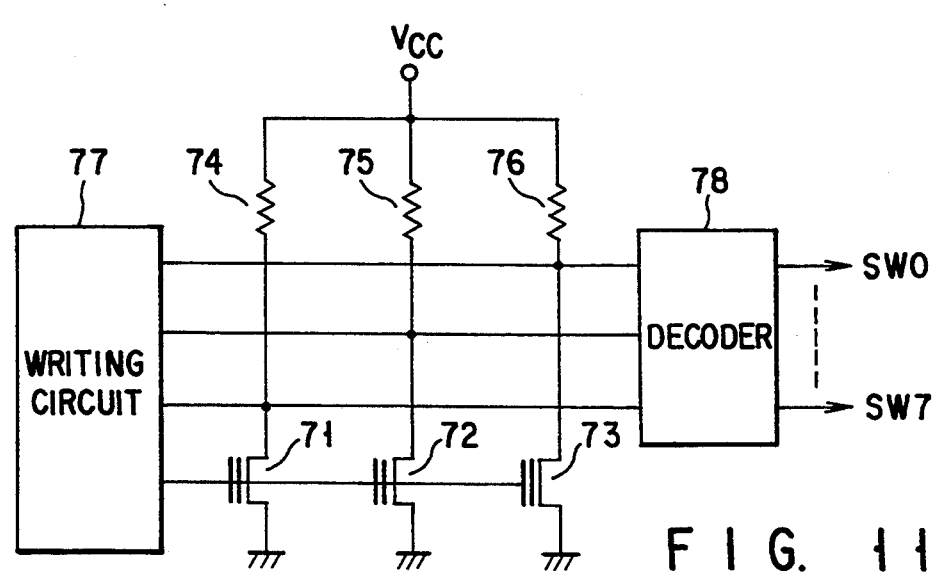
FIG. 11 is a circuit diagram of an input circuit used when a control signal used in the EEPROM of the embodiment shown in FIG. 5 is generated inside the EEPROM.

FIG. 11 illustrates the structure of a circuit which is used to generate the control signal pairs SW0 and $\overline{SW0}$ to SW7 and $\overline{SW7}$ in the EEPROM. In this example, a plurality of MOSFETs having the same structure as the memory cells of the EEPROM are used to store data, data is read from those MOSFETs when the divided voltage is selected, and the control signal pairs SW0 and $\overline{SW0}$ to SW7 and $\overline{SW7}$ are generated on the basis of the read data. This design eliminates the need for external terminals for inputting the control signal pairs SW0 and $\overline{SW0}$ to SW7 and $\overline{SW7}$.

More specifically, MOSFETs 71, 72 and 73 each having a floating gate and a control gate like the memory cells 11 have their sources connected to the reference voltage of 0 V and their drains connected respectively via load resistors 74, 75 and 76 to the source voltage vcc. The control gates and drains of the MOSFETs 71 to 73 are connected to a write circuit 77, so that a high write voltage output from the write circuit 77 when data is written is supplied to the control gates and drains of the MOSFETs 71–73.

After the writing is complete, signals at the drains of the MOSFETs 71–73 are supplied to a decoder 78. The decoder 78 decodes those signals to generate the eight control signals SW0–SW7. In this case, the inverted signals of SW0–SW7 can also be formed by using an inverter (not shown).

Although the foregoing description of this embodiment has been given with reference to the case where this invention is applied to a NAND cell type EEPROM, this invention may be applied to a NOR cell type EEPROM as well.

FIG. 12 is a circuit diagram showing the structure of a NOR cell type EEPROM according to the second embodiment of this invention.

In this diagram, a memory cell array 80, like the one shown in FIG. 2, comprises a plurality of memory cells 81 each constituted of an N channel MOSFET having a floating gate and a control gate. Those memory cells 81 have their drains connected to associated bit lines BL, their control gates connected to associated word lines WL and their sources all connected to a common source line S.

The word lines WL are selectively driven on the basis of address signals at the time of data writing, data erasure and data reading. The address signals are supplied to an address decoder 82. The address decoder 82 comprises a decoder 83 for decoding the input address signal and a word line driver 84 for supplying a predetermined voltage to the word lines WL in accordance with the output of this decoder 83. The word line driver 84 receives a write voltage VPP and an erase voltage VE' in addition to a source voltage Vcc of, for example, 3.3 V and a reference voltage of 0 V.

In the diagram, reference numeral "85" denotes an erase voltage generator which generates the erase voltage VE'. This erase voltage generator 85 comprises a voltage dropping circuit 86, a voltage limiter 87 and a voltage setting circuit 88.

The voltage dropping circuit 86 provides a negative voltage using the source voltage Vcc of 3.3 V. The output terminal of this voltage dropping circuit 86 is connected to one end of the voltage limiter 87, so that the negative voltage acquired by the voltage dropping circuit 86 is limited to a given value by the voltage limiter 87. This limited voltage is output as the erase voltage VE'. The other end of the voltage limiter 87 is connected to the voltage setting circuit 88, which arbitrarily sets the voltage at said other end of the voltage limiter 87 to change the value of VE' as needed. The voltage limiter 87 may be the voltage limiter 21 in FIG. 6 with the polarity of each Zener diode inverted or the voltage limiters in FIGS. 9A and 9B with the polarity of each Zener diode inverted also. As the specific structure of the voltage limiter 88 is basically the same as the structure shown in FIG. 6, its description will not be repeated.

In the NOR cell type EEPROM immediately after manufacturing, all the memory cells are written with data or electrons are accumulated in the floating gates. In programming of data in such an EEPROM, it is necessary to erase data of a selected memory cell. This data erasing is carried out as follows. The erase voltage VE' of, for example, about −8 V is supplied to the control gate of the selected memory cell while the source voltage Vcc of 3.3 V is supplied to the sources of all the memory cells. The erase voltage generator 85 generates this erase voltage VE' of about −8 V. The erase voltage VE' is supplied to one word line WL from the word line driver 84 in accordance with an input address signal. Electrons are discharged from the floating gate of the selected memory cell to whose control gate the erase voltage VE' is supplied, erasing the data. In other time than the data erasure, the common source line S is kept at 0 V.

To erase data from the NOR cell type EEPROM, conventionally, an intelligent erasing system is used as in the case of a NAND cell type EEPROM. This system changes the erase voltage gradually and accomplishes data erasure in a plurality of erasing actions, not in one action. The intelligent erasing system normally repeats erasing erasure and reading data after data erasure. When the read data matches with the erased data, this system terminates the erasing operation.

As the intelligent erasing system should perform data erasure a plurality of times, it undesirably needs a longer time to accomplish data erasure. In the case of the NOR cell type EEPROM of this embodiment, however, as the erase voltage VE' that matches the characteristic of the memory cells can be set in advance, the data erasure can be accomplished in a single erasing action. That is, the erasing time can be shortened while the same erasing characteristic as the conventional intelligent erasing system is maintained. The EEPROM of this embodiment can therefore achieve high-speed data erasure.

In the first embodiment shown in FIG. 5, it is necessary to apply the write voltage VPP to the control gates of a plurality of memory cells at the time of data writing. Further, the bit line BL is divided into a plurality of bit lines in accordance with an increase in the capacity of the memory cells and it is necessary to apply the intermediate voltage VM to all the bit lines BL at the time of data writing. To improve the writing time, it is necessary to boost both voltages VPP and VM to predetermined values immediately after the functions of the high voltage generators 17 and 18 start. This requires charge pump circuits with a large boosting performance to accomplish the charging of the output voltages in a short period of time. A large charge pump circuit means an increase in the value of the capacitors 105 in FIG. 3. At the time those capacitors 105 are driven by the clock signals $\phi 1$ and $\phi 2$, the current consumed in the charging or discharging of the capacitors increases. Further, the sharper the rising of the voltages VPP and VM is, the larger value is needed for the capacitors 105 used in the charge pump circuits, thus increasing the consumed current.

Such an increase in the consumed current in the charge pump circuit due to the increase in the capacity of the memory cells also occurs at the time of data erasure. Particularly, when data is erased collectively, the performance of boosting VPP should be increased in proportion to the increase in the memory capacity, resulting in an inevitable increase in the consumed current in the charge pump circuits which generate the voltage VPP.

The increase in current consumption, due to the increase in memory capacity, at the time of writing or erasing data in or from an EEPROM that is driven by a single power source shortens the life of a battery when this EEPROM is used in a battery-driven, portable type machine or may generate current noise inside the EEPROM when the large-capacitance capacitors are charged or discharged. Such a phenomenon is not desirable from the viewpoints of the function and reliability.

FIG. 13 is a circuit diagram showing the structure of the third embodiment of the present invention designed to make the rising of both voltages VPP and VM sharper without increasing the current consumption. This diagram uses like or same reference numerals as used in FIG. 5 to specify corresponding or identical portions to avoid repeating their detailed description.

This embodiment differs from the one shown in FIG. 5 in that a voltage detector 61 is provided which detects the output voltage of the booster circuit 20 (the output voltage VPP of the booster circuit 20 in the high voltage generator 17 in this embodiment) and the functions of the ring oscillators 19 in the high voltage generators 17 and 18 are controlled in accordance with the detection output of the voltage detector 61. In other words, one of the two oscillation periods of the ring oscillator 19 can be selected in accordance with the detection output of the voltage detector 61.

Figure 14:
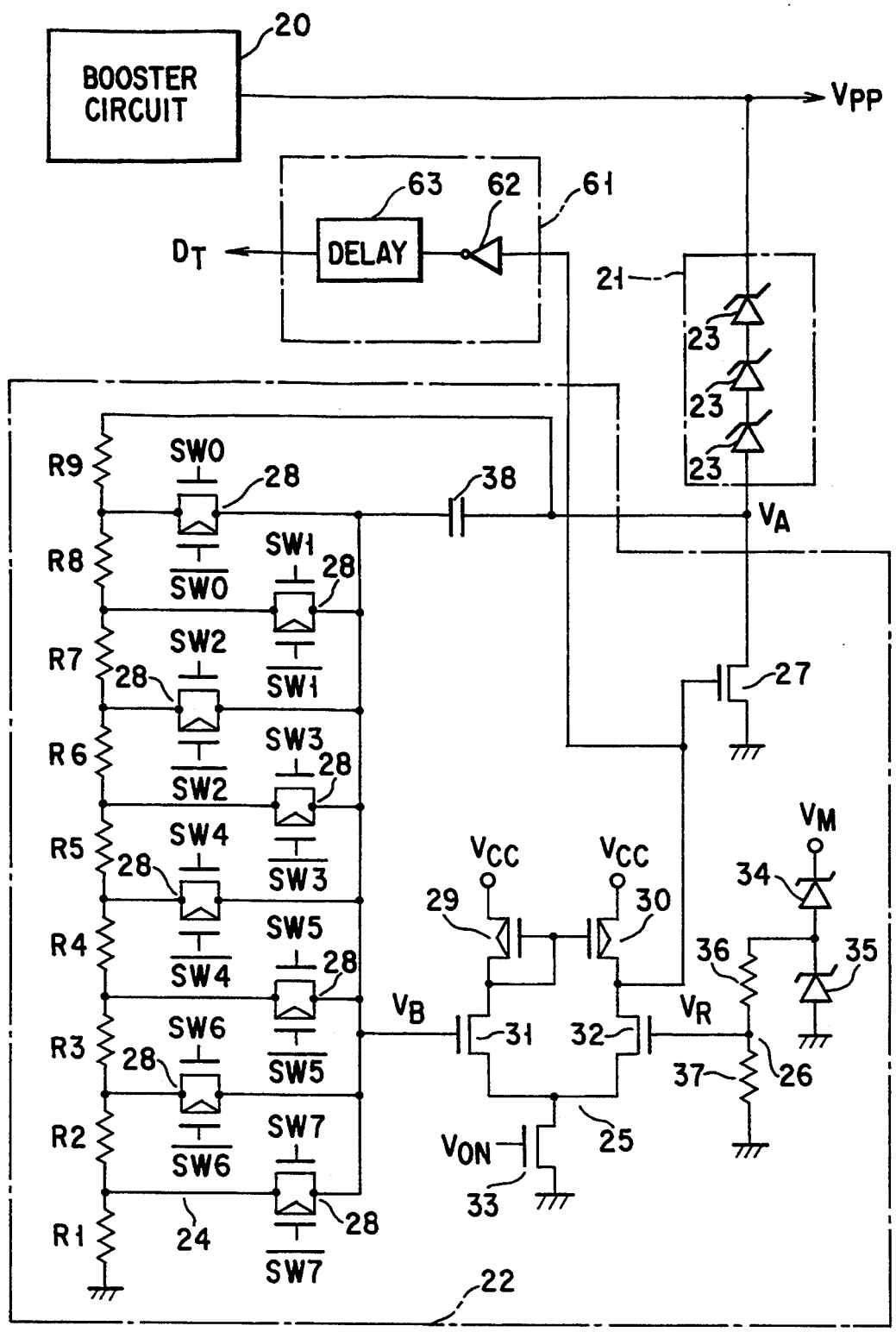
FIG. 14 is a detailed circuit diagram showing specific structures of a voltage limiter, a voltage setting circuit and a voltage detector in one of high voltage generators in the EEPROM shown in FIG. 13.

FIG. 14 is a detailed circuit diagram showing specific structures of the voltage limiter 21, voltage setting circuit 22 and voltage detector 61 in one of the high voltage generators, 17, which generates the write voltage VPP according to the embodiment shown in FIG. 13.

As illustrated, the voltage detector 61 comprises an inverter 62 supplied with the output of the voltage comparator 25 and a delay circuit 63 which outputs the output of the inverter 62 after a predetermined delay time. The output of this delay circuit 63 is supplied as a detection signal DT to both ring oscillators 19.

In the thus constituted circuit, the level of the detection output DT of the voltage detector 61 becomes "0" when the output voltage VPP of the booster circuit 20 is equal to or below a predetermined value, and the level of DT becomes "1" when the output voltage VPP exceeds the predetermined value.

When the voltage VPP is detected by the inverter 62 and the function of the ring oscillator 19 is controlled by the output of this inverter 62, the output voltage of the booster circuit 20 may come slightly below the predetermined voltage and may not reach this predetermined value in some cases. In this respect, the voltage detector 61 is provided to delay the output of the inverter 62 by about 1 μs to increase the stability of the voltage VPP.

Figure 15:
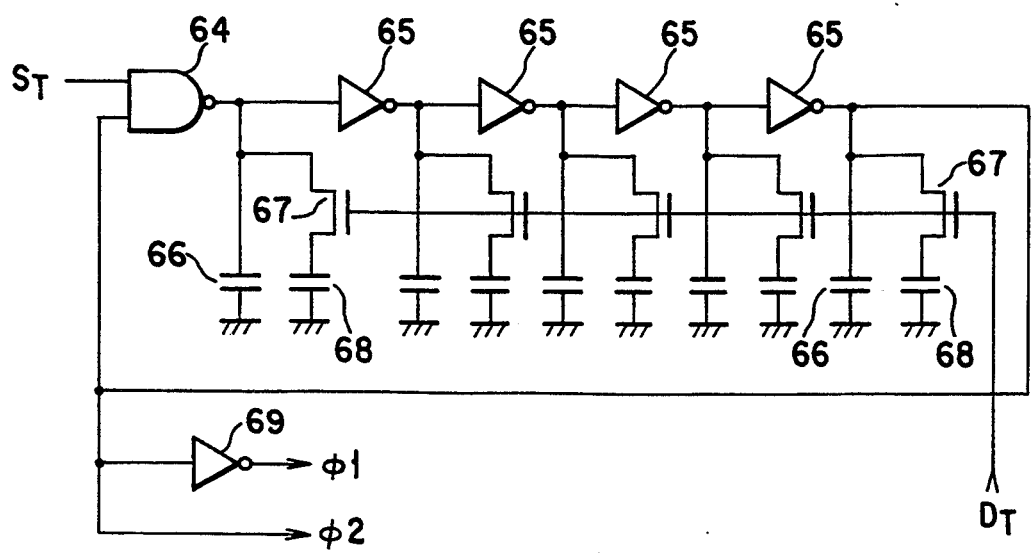
FIG. 15 is a circuit diagram showing the detailed structure of a ring oscillator used in the EEPROM shown in FIG. 13.

FIG. 15 is a circuit diagram showing the detailed structure of the ring oscillator 19 used in the embodiment shown in FIG. 13, which can select a proper oscillation period. This ring oscillator 19 has an two-input NAND gate 64 and an even number of inverters 65 (four inverters in this example) cascade-connected in multi-stages. A capacitor 66 is connected between the input end of each inverter 65 and the reference voltage of 0 V. A series circuit of an N channel MOSFET 67 and a capacitor 68 connected to the source-drain line thereof is connected in parallel to each capacitor 66. The NAND gate 64 receives a start signal ST for starting the oscillation and the output of the last stage of inverter among the four cascade-connected inverters 65, the latter signal in a feedback loop. The detection output signal DT of the voltage detector 61 is supplied in parallel to the gates of the individual MOSFETs 67. The clock signals φ 1 and φ 2 having different phases are obtained as the output signal of the last-stage inverter and an inverted signal of this output signal obtained by another inverter 69.

Figure 16:
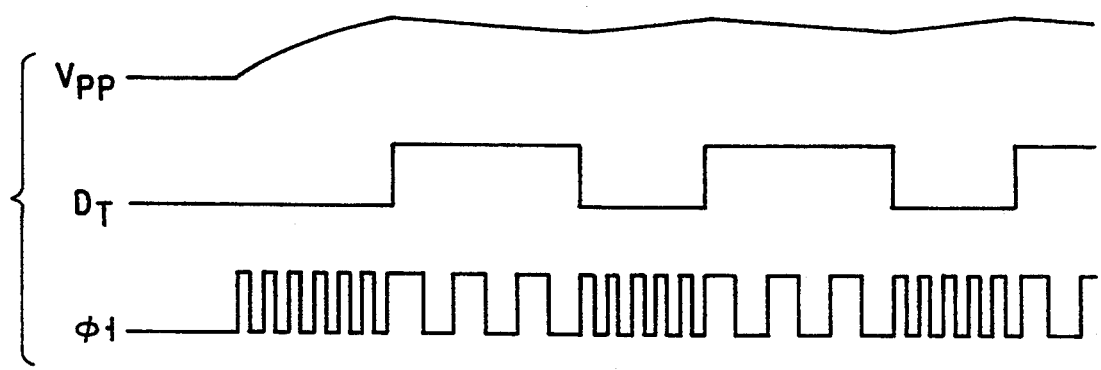
FIG. 16 is a timing chart for explaining the function of the ring oscillator shown in FIG. 15.

The function of the thus constituted ring oscillator will be described referring to the timing chart shown in FIG. 16. When the start signal ST is supplied, the oscillation starts. As VPP is low immediately after the oscillation has started, the detection output signal DT of the voltage detector 61 has a level of "0" and the individual MOSFETs 67 are not conducting. At this time, only each capacitor 66 is connected between the input end of each inverter 65 and the reference voltage so that the ring oscillator 19 oscillates at a relatively short period in accordance with the capacitances of those capacitors 66. Based on the oscillation signal, two-phase clock signals φ 1 and φ 2 (having complementary levels) are output. In the booster circuit 20 to which the clock signals φ 1 and φ 2 having such a short period are supplied, the charging or discharging of the capacitors 105 (see FIG. 3) is frequently performed, thus boosting the source voltage Vcc in a short period of time.

When the output voltage VPP of the booster circuit 20 exceeds the predetermined value and the level of the detection output signal DT of the voltage detector 61 becomes "1," the individual MOSFETs 67 are turned on, permitting the capacitors 66 and 68 connected in parallel between the input end of each inverter 65 and the reference voltage. As a result, the delay time of the input signal to each inverter 65 increases, so that the ring oscillator 19 oscillates at a longer period than it does when the level of DT is "0." Based on the oscillation signal, two-phase clock signals φ 1 and φ 2 having a longer period than the one in the previous case are formed. The function of the booster circuit 20 is controlled by the clock signals, keeping VPP stable. Since the charging or discharging of the capacitors 105 in the booster circuit 20 at this time is not as frequent as that performed when the level of DT is "0," the consumed current in the booster circuit 20 is reduced.

When VPP drops due to a current leak or noise, the voltage detector 61 detects this state and the level of its detection output signal DT becomes "0." This turns off the individual MOSFETs 67 again. Accordingly, the ring oscillator 19 oscillates again at a relatively short period and the dropped output voltage of the booster circuit 20 is raised again to VPP. The above sequence of actions is repeated to generate a stable voltage VPP.

According to this embodiment, under an ideal condition, i.e., without any current leak or noise, after VPP reaches a predetermined level after the boosting has started, the ring oscillator 19 keeps oscillating at a short period and the booster circuit 20 functions at a low speed. Therefore, low current consumption can be achieved.

Figure 17:
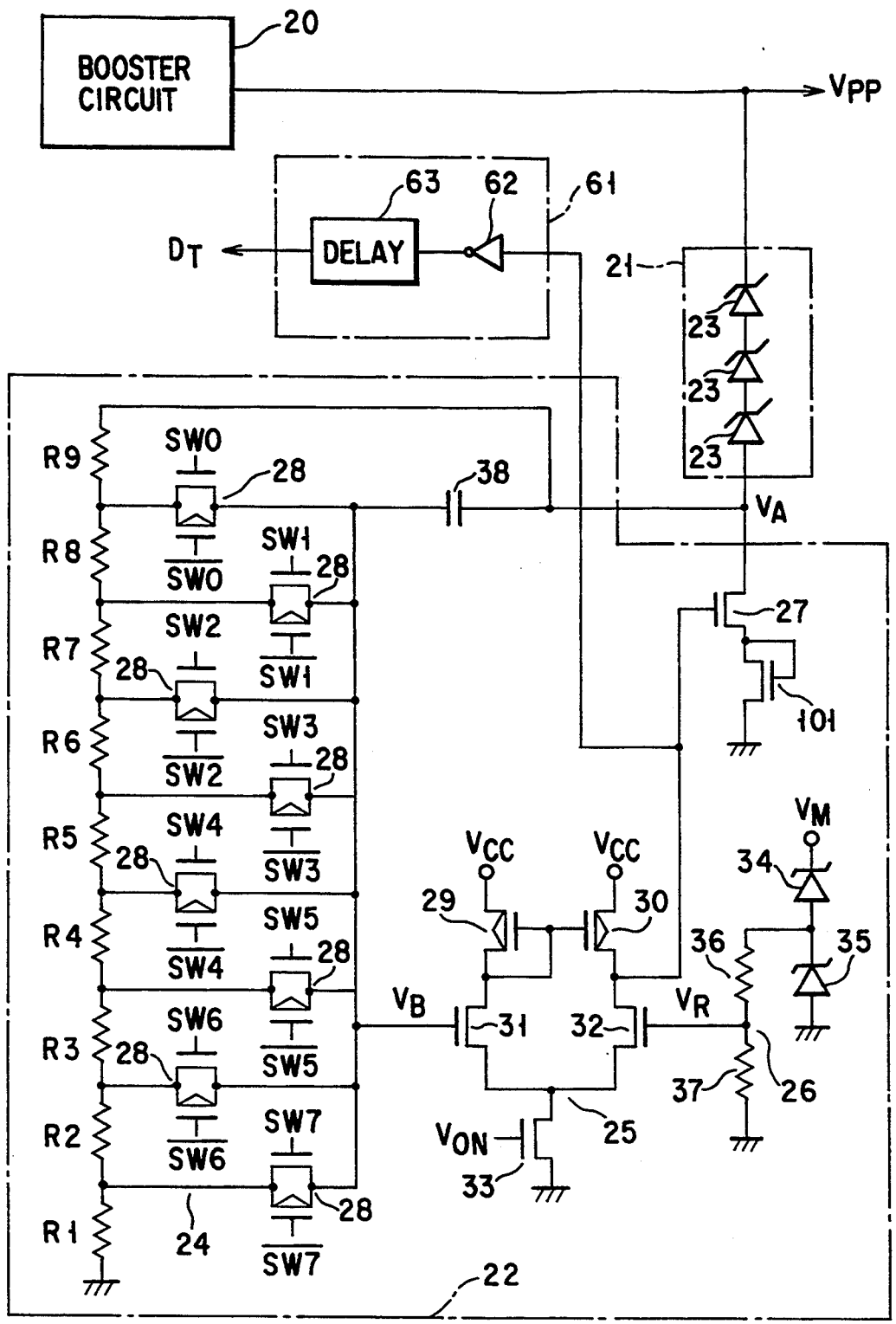
FIG. 17 is a detailed circuit diagram showing different specific structures of a voltage limiter, a voltage setting circuit and a voltage detector in one of high voltage generators in the EEPROM shown in FIG. 13.

FIG. 17 is a detailed circuit diagram showing different specific structures of the voltage limiter 21, voltage setting circuit 22 and voltage detector 61 in one of the high voltage generators, 17, which generates the write voltage VPP, in the embodiment shown in FIG. 13. This circuit differs from the one shown in FIG. 14 in that a gate-drain short-circuited N channel MOSFET 101 has its source and drain inserted between the aforementioned voltage dropping N channel MOSFET 17 and the reference voltage of 0 V in the voltage setting circuit 22.

The provision of the MOSFET 101 can shift the value of VA by a threshold voltage of this MOSFET 101, so that the voltage detector 61 can performs its detection with VPP in a more stable state.

Figure 18:
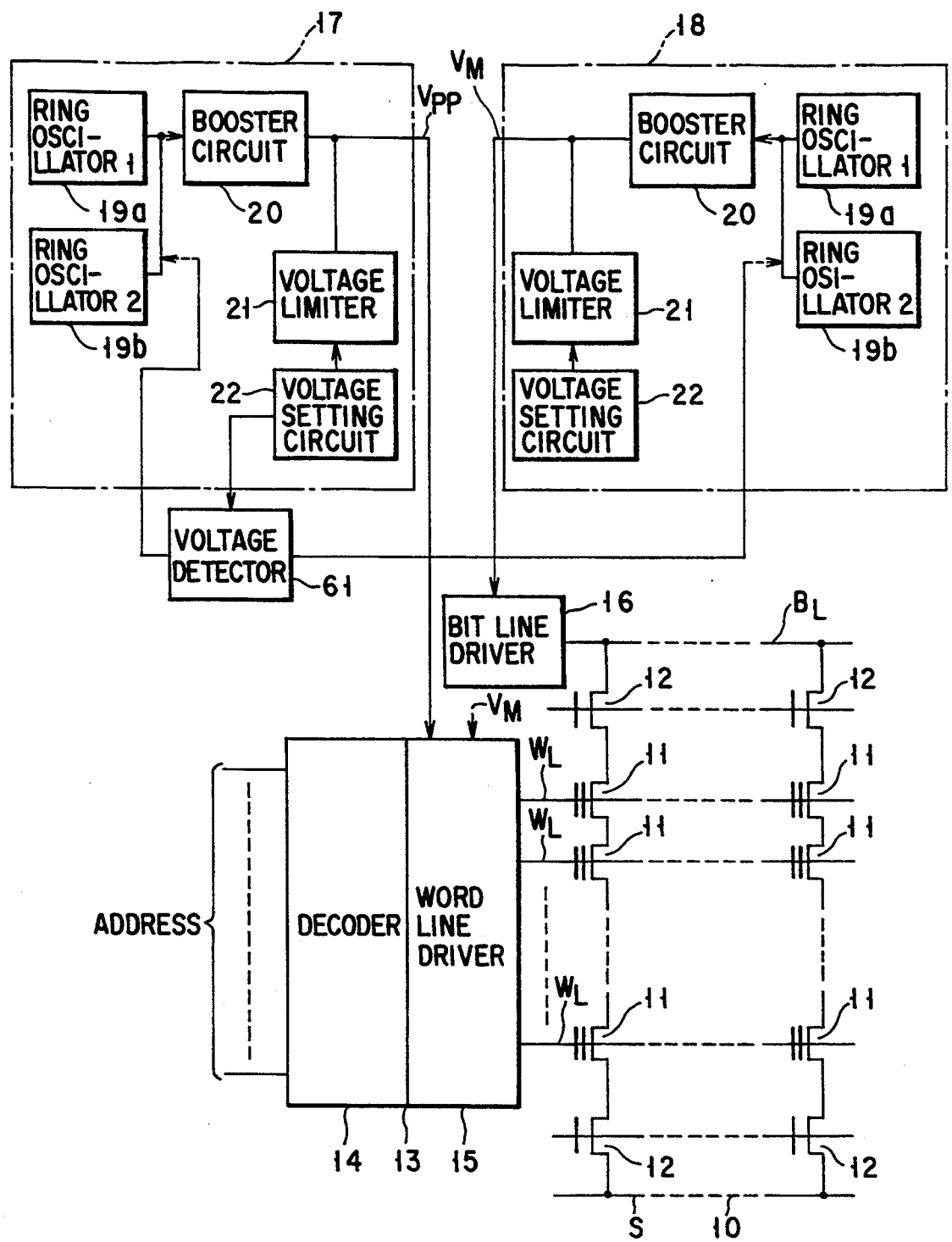
FIG. 18 is a circuit diagram showing the structure of a NAND cell type EEPROM according to a fourth embodiment of the present invention.

FIG. 18 is a circuit diagram showing the structure of the fourth embodiment of the present invention which is designed to make the rising of the voltages VPP and VM sharper without increasing the current consumption as per the embodiment shown in FIG. 13. This diagram uses like or same reference numerals as used in FIG. 13 to specify corresponding or identical portions to avoid repeating their detailed description.

In this embodiment, two ring oscillators 19a and 19b having different oscillation periods are provided in each of the high voltage generators 17 and 18, and the outputs of the ring oscillators 19a and 19b are selectively output to the booster circuit 20 based on the detection output of the voltage detector 61.

FIG. 19 is a circuit diagram showing specific structures of the two ring oscillators 19a and 19b and a selector for selecting one of the outputs of those oscillators, which are included in one of the high voltage generators, 17, in the fourth embodiment.

Each of the ring oscillators 19a and 19b has an two-input NAND gate 111 and an even number of inverters 112 (four inverters in this example) cascade-connected in multi-stages. A capacitor 113 is connected between the input end of each inverter 112 of one of the ring oscillators, 19a, and the reference voltage of 0 V, while a capacitor 114 having a larger capacitance than the capacitor 113 is connected between the input end of each inverter 112 in the other ring oscillator 19b and the reference voltage of 0 V. The NAND gate 111 in each ring oscillator 19a or 19b receives a start signal ST for starting the oscillation and the output signal of the last-stage inverter among the four cascade-connected inverters 112 in the associated ring oscillator, the latter signal in a feedback loop.

The outputs of both ring oscillators 19a and 19b are supplied together with the detection output signal DT of the voltage detector 61 to a selector 130. This selector 130 comprises a series circuit 135 of two P channel MOSFETs 131 and 132 and two N channel MOSFETs 133 and 134, another series circuit 140 of two P channel MOSFETs 136 and 137 and two N channel MOSFETs 138 and 139, and an inverter 141 for inverting the detection output signal DT. The sources and drains of the P channel MOSFETs 131 and 132 and the N channels MOSFETs 133 and 134 are connected in series between the source voltage Vcc and the reference voltage of 0 V. The sources and drains of the P channel MOSFETs 136 and 137 and the N channels MOSFETs 138 and 139 are likewise connected in series between the source voltage Vcc and the reference voltage of 0 V. The output terminals of the series circuits 135 and 140 are connected together. The input end of an inverter 142 for acquiring the clock signal $\phi$ 1 is connected to the node between those series circuits. The other clock signal $\phi$ 2 is obtained directly from this node.

The output signal of one of the ring oscillators, 19a, is supplied to the gates of both MOSFETs 132 and 133 in the series circuit 135 while the output signal of the other ring oscillators 19b is supplied to the gates of both MOSFETs 137 and 138 in the series circuit 140. The detection signal DT is supplied to the gates of the MOSFETs 131 and 139 directly, and to the gates of the MOSFETs 134 and 136 via the inverter 141.

When the start signal ST is supplied to the thus constituted circuit, the oscillation of both ring oscillators 19a and 19b starts. As the capacitance of the capacitor 114 in the ring oscillator 19b is set larger than that of the capacitor 113 in the ring oscillator 19a, the oscillation frequency of the ring oscillator 19a is higher than that of the ring oscillator 19b.

When the level of the signal DT is "0," the MOSFETs 130 and 134 in the series circuit 135 are both turned on, and the output of the ring oscillator 19a is inverted by this series circuit 135. In this case, therefore, the output of the ring oscillator 19a having a higher oscillation frequency is selected, and the clock signals $\phi$ 1 and $\phi$ 2 are produced based on the selected signal.

When the level of the signal DT is "1," the MOSFETs 136 and 139 in the series circuit 140 are both turned on, and the output of the other ring oscillator 19b is inverted by this series circuit 140. In this case, therefore, the output of the ring oscillator 19b having a lower oscillation frequency is selected, and the clock signals $\phi$ 1 and $\phi$ 2 are produced based on the selected signal.

The present invention is not limited to the above-described embodiments, and may be modified in various other manners. For instance, in the individual embodiments, the voltage is divided by the nine resistors R1-R9 in the voltage setting circuit and one proper voltage is selected in accordance with the control signal pairs SW0 and $\overline{SW0}$ to SW7 and $\overline{SW7}$ as shown in FIG. 6. If one of the nodes between the resistors and the input terminal of the voltage comparator 25 may be fixedly coupled by a bonding wire at the time of factory shipment, the optimum write voltage and erase voltage for that EEPROM may be determined. Further, the voltage may be divided by using series-connected capacitors provided in place of the resistors R1-R9.

Although the source voltage Vcc is 3.3 V in the individual embodiments, this invention may also be applied to the case of a different source voltage, for example, 5 V.

In short, this invention can provide a semiconductor integrated circuit device, which can always generate constant optimal data writing voltage and erasing voltage, thus shortening the time for programming, such as data writing, and can change the voltage value.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor integrated circuit device comprising:
   voltage dropping means for dropping a power source voltage;
   voltage limiting means having two ends one of which is connected to an output terminal of said voltage dropping means, for limiting an output voltage of said voltage dropping means to a given value;
   voltage setting means, connected to the other end of said voltage limiting means, for arbitrarily adjusting a voltage at said other end of said voltage limiting means; and
   a plurality of memory cells each constituted of an erasable and programmable MOSFET having a floating gate and a control gate which is supplied with a voltage appearing on said output terminal of said voltage dropping means.

2. The semiconductor integrated circuit device according to claim 1, wherein said voltage limiting means comprises one or more Zener diodes connected in series.

3. The semiconductor integrated circuit device according to claim 2, wherein a Zener breakdown voltage of said Zener diodes is set in a range from 4 V to 7 V.

4. The semiconductor integrated circuit device according to claim 1, wherein said voltage setting means comprises:
   voltage generating means for generating an arbitrary voltage having a value between said other end of said voltage limiting means and a reference voltage;
   voltage comparing means for receiving said arbitrary voltage generated by said voltage generating means as one input;
   comparison-voltage generating means for generating a comparison voltage to be supplied as an other input of said voltage comparing means; and
   a MOS type switching element which has a current path inserted between said other end of said voltage limiting means and said reference voltage and whose gate is controlled by a comparison output of said voltage comparing means.

5. The semiconductor integrated circuit device according to claim 4, wherein said voltage generating means comprises:
   a plurality of resistors inserted in series between said other end of said voltage limiting means and said reference voltage; and
   a plurality of voltage selecting means for selecting voltages appearing at nodes between said series-connected resistors in accordance with a control signal.

6. The semiconductor integrated circuit device according to claim 5, wherein each of said plurality of voltage selecting means is constituted of a transfer gate.

7. A semiconductor integrated circuit device comprising:
   a first high voltage generator for generating a first high voltage, said first high voltage generator having a first oscillation circuit, first booster means for boosting a power source voltage based on an oscillation signal generated by said first oscillation circuit, first voltage limiting means having two ends one of which is connected to an output terminal of said first booster means, for limiting an output voltage of said first booster means to a given value, and first voltage setting means, connected to the other end of said first voltage limiting means, for arbitrarily adjusting a voltage at said other end of said first voltage limiting means;

a second high voltage generator for generating a second high voltage, said second high voltage generator having a second oscillation circuit, second booster means for boosting said power source voltage based on an oscillation signal generated by said second oscillation circuit, second voltage limiting means having two ends one of which is connected to an output terminal of said second booster means, for limiting an output voltage of said second booster means to a given value, and second voltage setting means, connected to the other end of said second voltage limiting means, for arbitrarily adjusting a voltage at said other end of said second voltage limiting means;

a plurality of NAND cells each having a plurality of series-connected MOSFETs each having a floating gate and a control gate;

a bit line to which one end of each of said plurality of NAND cells is commonly connected;

a plurality of word lines to which said control gates of said memory cells of each of said plurality of NAND cells are respectively connected;

address decoding means for receiving said first high voltage generated by said first high voltage generator and an address input and selectively supplying said first high voltage to said plurality of word lines in accordance with said address input; and bit-line voltage supplying means for supplying one of said second high voltage generated by said second high voltage generator and said source voltage to said bit line.

8. A semiconductor integrated circuit device comprising:

booster means for boosting a power source voltage;

voltage limiting means comprising one or more Zener diodes connected in series, the voltage limiting means having two ends, one of the two ends being connected to an output terminal of said booster means, for limiting an output voltage of said booster means to a given value; and voltage setting means, connected to the other of the two ends of said voltage limiting means, for arbitrarily adjusting a voltage at said other end of said voltage limiting means, wherein said voltage setting means comprises:

voltage generating means for generating an arbitrary voltage having a value between said other end of said voltage limiting means and a reference voltage, said voltage generating means comprising a plurality of resistors inserted in series between said other end of said voltage limiting means and said reference voltage and a plurality of voltage selecting means for selecting voltages appearing at nodes between said series-connected resistors in accordance with a control signal, voltage comparing means for receiving said arbitrary voltage generated by said voltage generating means as one input, comparison-voltage generating means for generating a comparison voltage to be supplied as an other input of said voltage comparing means, and a MOS type switching element which has a current path inserted between said other end of said voltage limiting means and said reference voltage and whose gate is controlled by a comparison output of said voltage comparing means.

9. The semiconductor integrated circuit device according to claim 8, wherein a Zener breakdown voltage of said Zener diodes is set in a range from 4 V to 7 V.

10. The semiconductor integrated circuit device according to claim 8, wherein each of said plurality of voltage selecting means comprises a transfer gate.

11. A semiconductor integrated circuit device comprising:

booster means for boosting a power source voltage;

voltage limiting means comprising one or more Zener diodes connected in series, the voltage limiting means having two ends, one of which is connected to an output terminal of said booster means, for limiting an output voltage of said booster means to a given value;

voltage setting means, connected to the other of the two ends of said voltage limiting means, for arbitrarily adjusting a voltage at said other end of said voltage limiting means;

a plurality of NAND cells each having a plurality of series-connected MOSFETs each having a floating gate and a control gate;

a plurality of word lines to which said control gates of said memory cells of each of said plurality of NAND cells are respectively connected; and address decoding means, connected to said output terminal of said booster means, for selectively supplying a voltage appearing on said output terminal of said booster means to said plurality of word lines in accordance with an address input, wherein said voltage setting means comprises:

voltage generating means for generating an arbitrary voltage having a value between said other end of said voltage limiting means and a reference voltage, said voltage generating means comprising a plurality of resistors inserted in series between said other end of said voltage limiting means and said reference voltage and a plurality of voltage selecting means for selecting voltages appearing at nodes between said series-connected resistors in accordance with a control signal, voltage comparing means for receiving said arbitrary voltage generated by said voltage generating means as one input, comparison-voltage generating means for generating comparison voltage to be supplied as an other input of said voltage comparing means, and a MOS type switching element which has a current path inserted between said other end of said voltage limiting means and said reference voltage and whose gate is controlled by a comparison output of said voltage comparing means.

12. The semiconductor integrated circuit device according to claim 11, wherein a Zener breakdown voltage of said Zener diodes is set in a range from 4 V to 7 V.

13. The semiconductor integrated circuit device according to claim 11, wherein each of said plurality of voltage selecting means comprises a transfer gate.

14. A semiconductor integrated circuit device comprising:
   booster means for boosting a power source voltage;
   voltage limiting means for limiting an output voltage of said booster means to a given value; and
   voltage detecting means for detecting said output voltage of said booster means, whereby a function of said booster means is controlled in accordance with an output of said voltage detecting means, wherein said booster means includes an oscillation circuit, controlled in accordance with a detection result of said voltage detecting means, whereby an oscillation period of said oscillation circuit changes in accordance with said detection result of said voltage detecting means.

15. The semiconductor integrated circuit device according to claim 14, wherein said oscillation circuit is controlled so that said oscillation period becomes longer than before when said output voltage of said booster means exceeds a predetermined value.

16. The semiconductor integrated circuit device according to claim 14, wherein said booster means includes at least two oscillation circuits having different oscillation periods, and said function of said booster means is controlled in such a way that one of outputs of said at least two oscillation circuits is selected in accordance with said detection result of said voltage detecting means.

17. The semiconductor integrated circuit device according to claim 14, wherein said booster means includes first and second oscillation circuits having different oscillation periods, and said function of said booster means is controlled in such a way that an output of said first oscillation circuit is selected when said output voltage of said booster means is equal to or below a predetermined value and an output of said second oscillation circuit whose oscillation period is longer than that of said first oscillation circuit is selected when said output voltage of said booster means exceeds a predetermined value.

* * * * *